(12) United States Patent
Seo et al.

(10) Patent No.: US 11,380,739 B2
(45) Date of Patent: Jul. 5, 2022

(54) DISPLAY DEVICE HAVING TRANSMISSION HOLE PASSING THROUGH SUBSTRATE AND THIN-FILM ENCAPSULATION LAYER AND MANUFACTURING METHOD THEREOF

(71) Applicant: Samsung Display Co., Ltd., Yongin-si (KR)

(72) Inventors: Hyunsang Seo, Yongin-si (KR); Kihyun Kim, Yongin-si (KR); Younggil Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 83 days.

(21) Appl. No.: 16/826,138

(22) Filed: Mar. 20, 2020

(65) Prior Publication Data

US 2020/0328377 A1 Oct. 15, 2020

(30) Foreign Application Priority Data

Apr. 11, 2019 (KR) .................. 10-2019-0042669

(51) Int. Cl.
*H01L 27/32* (2006.01)
*H01L 51/56* (2006.01)
*H01L 51/52* (2006.01)

(52) U.S. Cl.
CPC ...... *H01L 27/3225* (2013.01); *H01L 51/5253* (2013.01); *H01L 51/56* (2013.01); *H01L 2227/323* (2013.01)

(58) Field of Classification Search
CPC . H01L 51/5253; H01L 51/56; H01L 27/3225; H01L 27/3227; H01L 27/323
See application file for complete search history.

(56) References Cited

U.S. PATENT DOCUMENTS 9,632,487 B2  4/2017 Kim et al.
2007/0057260 A1* 3/2007 Lee .................. H01L 27/1248
257/72

(Continued)

FOREIGN PATENT DOCUMENTS

JP    2018-87863 A    6/2018
KR   10-2016-0080310 A   7/2016

(Continued)

*Primary Examiner* — Michael Jung
(74) *Attorney, Agent, or Firm* — Lewis Roca Rothgerber Christie LLP (57) ABSTRACT

A method of manufacturing a display device includes forming a display unit including a main display area and a sensor area over a substrate, the main display area including a main pixel, and the sensor area including an auxiliary pixel and a transmission portion, the forming of the display unit including preparing a hard substrate defining an empty space corresponding to a location of the transmission portion, forming a soft substrate on the hard substrate, forming the main display area and the sensor area on the soft substrate, forming a thin-film encapsulation layer covering the main display area and the sensor area, and forming a transmission hole in the empty space by removing the hard substrate, the transmission hole passing through from the soft substrate to the thin-film encapsulation layer, and arranging a component on one side of the substrate, the component for communicating a signal through the transmission portion.

20 Claims, 7 Drawing Sheets

(56) References Cited

U.S. PATENT DOCUMENTS

| | | | |
|---|---|---|---|
| 2007/0058116 A1* | 3/2007 | Lee | G02F 1/133555 |
| | | | 349/114 |
| 2007/0171157 A1* | 7/2007 | Choi | G02F 1/13318 |
| | | | 345/81 |
| 2009/0108264 A1* | 4/2009 | Inoue | C23C 26/00 |
| | | | 257/59 |
| 2016/0233289 A1* | 8/2016 | Son | H01L 51/52 |
| 2017/0133444 A1* | 5/2017 | Lee | H01L 27/3258 |
| 2018/0089485 A1* | 3/2018 | Bok | G06F 1/1684 |
| 2018/0145118 A1* | 5/2018 | Kim | H01L 27/326 |
| 2019/0019988 A1 | 1/2019 | Kang et al. | |
| 2019/0074345 A1 | 3/2019 | Lee et al. | |
| 2019/0123298 A1 | 4/2019 | Kanaya | |

FOREIGN PATENT DOCUMENTS

| | | |
|---|---|---|
| KR | 10-2017-0015632 A | 2/2017 |
| KR | 10-2017-0019553 A | 2/2017 |
| KR | 10-2018-0115387 A | 10/2018 |

* cited by examiner

DISPLAY DEVICE HAVING TRANSMISSION HOLE PASSING THROUGH SUBSTRATE AND THIN-FILM ENCAPSULATION LAYER AND MANUFACTURING METHOD THEREOF

CROSS-REFERENCE TO RELATED APPLICATION

This application claims priority to, and the benefit of, Korean Patent Application No. 10-2019-0042669, filed on Apr. 11, 2019, in the Korean Intellectual Property Office, the disclosure of which is incorporated herein in its entirety by reference.

BACKGROUND

1. Field

One or more embodiments relate to a display device, and to a manufacturing method thereof.

2. Description of the Related Art

Recently, the purposes of a display device have become more diversified. Also, as display devices have become thinner and more lightweight, their range of use has gradually been extended.

As a display device is variously used, there may be various methods in designing the shape of a display device. Also, functions that may be combined or associated with a display device are being added.

SUMMARY

One or more embodiments include a display device including a sensor area in which a component such as a sensor may be arranged, and include a method of manufacturing the display device. One or more embodiments include a display device that simplifies a manufacturing process, and that improves a moisture-proofing performance around a transmission hole through which a component signal passes, and include a method of manufacturing the display device. However, it should be understood that embodiments described herein should be considered in a descriptive sense only, and not for limitation of the disclosure.

According to one or more embodiments, a display device includes a substrate, a display unit over the substrate, and including a main display area including a main pixel, and a sensor area including an auxiliary pixel and a transmission portion, a thin-film encapsulation layer covering the main pixel and the auxiliary pixel of the display unit, and a component for exchanging a signal through the transmission portion, wherein the transmission portion includes a transmission hole passing through from the substrate to the thin-film encapsulation layer.

The thin-film encapsulation layer may include at least one organic layer and at least one inorganic layer that are stacked.

The display device my further include a dam around the transmission hole for blocking the at least one organic layer of the thin-film encapsulation layer from flooding the transmission hole.

The at least one inorganic layer of the thin-film encapsulation layer may cover an end of a layer between the substrate and the thin-film encapsulation layer, the end being adjacent the transmission hole.

The at least one inorganic layer of the thin-film encapsulation layer may cover an end of the substrate adjacent the transmission hole.

The thin-film encapsulation layer may include a plurality of inorganic layers with the at least one organic layer therebetween.

The substrate may include a transformable soft substrate.

The component may include a sensor, a lamp, or a speaker.

According to one or more embodiments, a method of manufacturing a display device includes forming a display unit including a main display area and a sensor area over a substrate, the main display area including a main pixel, and the sensor area including an auxiliary pixel and a transmission portion, the forming of the display unit including preparing a hard substrate defining an empty space corresponding to a location of the transmission portion, forming a soft substrate on the hard substrate, forming the main display area and the sensor area on the soft substrate, forming a thin-film encapsulation layer covering the main display area and the sensor area, and forming a transmission hole in the empty space by removing the hard substrate, the transmission hole passing through from the soft substrate to the thin-film encapsulation layer, and arranging a component on one side of the substrate, the component for communicating a signal through the transmission portion.

The forming of the thin-film encapsulation layer may include stacking at least one organic layer and at least one inorganic layer.

The method may further include forming a dam around the transmission hole for blocking the at least one organic layer of the thin-film encapsulation layer from flooding the transmission hole.

The at least one inorganic layer of the thin-film encapsulation layer may cover an end of a layer between the soft substrate and the thin-film encapsulation layer, the end being adjacent the transmission hole.

The at least one inorganic layer of the thin-film encapsulation layer may cover an end of the soft substrate adjacent the transmission hole.

The thin-film encapsulation layer may include a plurality of inorganic layers with the at least one organic layer therebetween.

The hard substrate may include a glass substrate.

The empty space may include a hole that completely passes through the hard substrate, or a recess that is indented in the hard substrate, the hard substrate including a glass substrate.

Inner walls of the empty space that face each other may be formed in parallel to each other.

Inner walls of the empty space that face each other may be formed non-parallel to each other.

The component may include a sensor, a lamp, or a speaker.

The method may further include using the empty space as a mark for alignment with a mask while the mask for forming the main display area and the sensor area is installed.

BRIEF DESCRIPTION OF THE DRAWINGS

The above and/or other aspects will become apparent and more readily appreciated from the following description of the embodiments, taken in conjunction with the accompanying drawings in which.

DETAILED DESCRIPTION

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
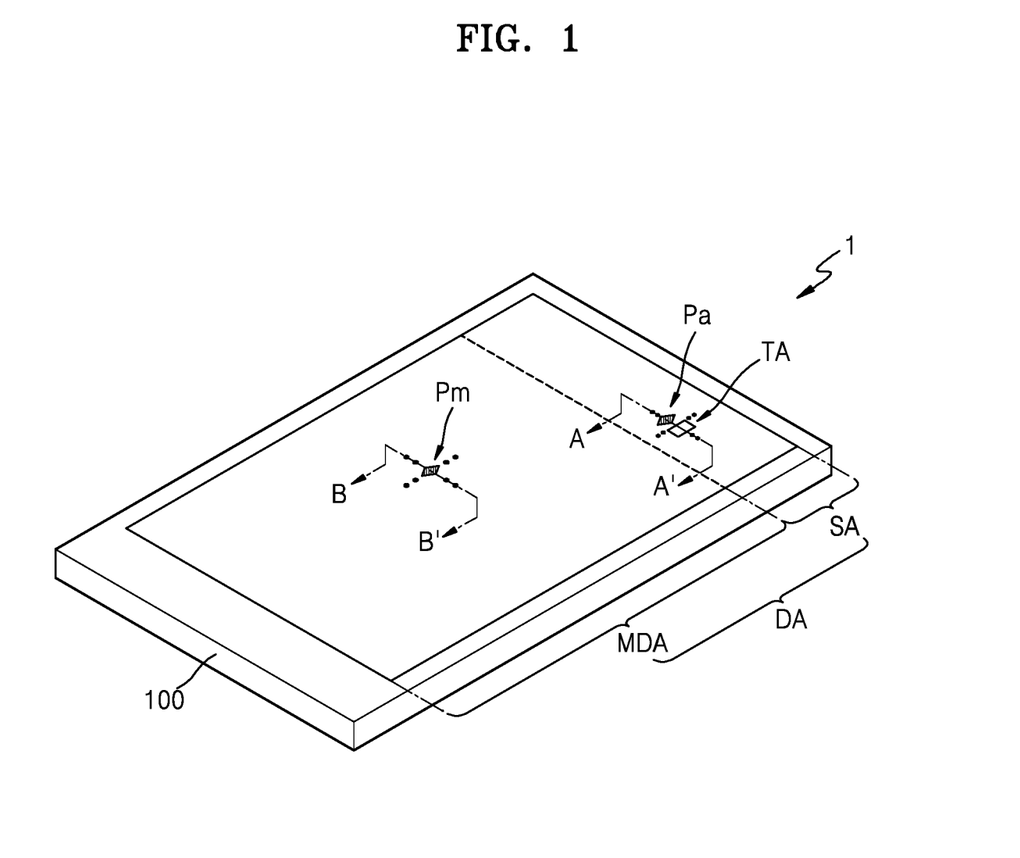
FIG. 1 is a perspective view of a display device according to an embodiment.

FIG. 1 is a perspective view of a display device 1 according to an embodiment.

As shown in FIG. 1, a display unit DA of the display device 1 includes a main display area MDA and a sensor area SA. The main display area MDA displays a main image by using light emitted from a plurality of main pixels Pm.

The sensor area SA is an area in which a component 300 (see FIG. 2), such as a sensor that uses a light signal or a sound signal, is arranged. The sensor area SA includes a transmission portion TA through which a light signal and/or a sound signal may pass. The light signal and/or the sound signal is output from the component 300 to the outside beyond the substrate 100, or propagates from the outside toward the component 300.

Also, a plurality of auxiliary pixels Pa are arranged in the sensor area SA, which displays an image by using light emitted from the plurality of auxiliary pixels Pa. That is, in addition to the main display area MDA, the sensor area SA displays an image by using the auxiliary pixels Pa. Because the transmission portion TA is arranged in the sensor area SA, the resolution of an image displayed by the sensor area SA may be lower than the resolution of an image displayed by the main display area MDA. In other words, due to the transmission portion TA, the number of auxiliary pixels Pa per unit area may be less than the number of main pixels Pm per unit area.

Though the display device 1 according to an embodiment is described as an organic light-emitting display device as an example, a display device according to other embodiments is not limited thereto. In other embodiments, a display device may be one of various types of display devices, such as an inorganic light-emitting display and a quantum dot light-emitting display.

Figure 2:
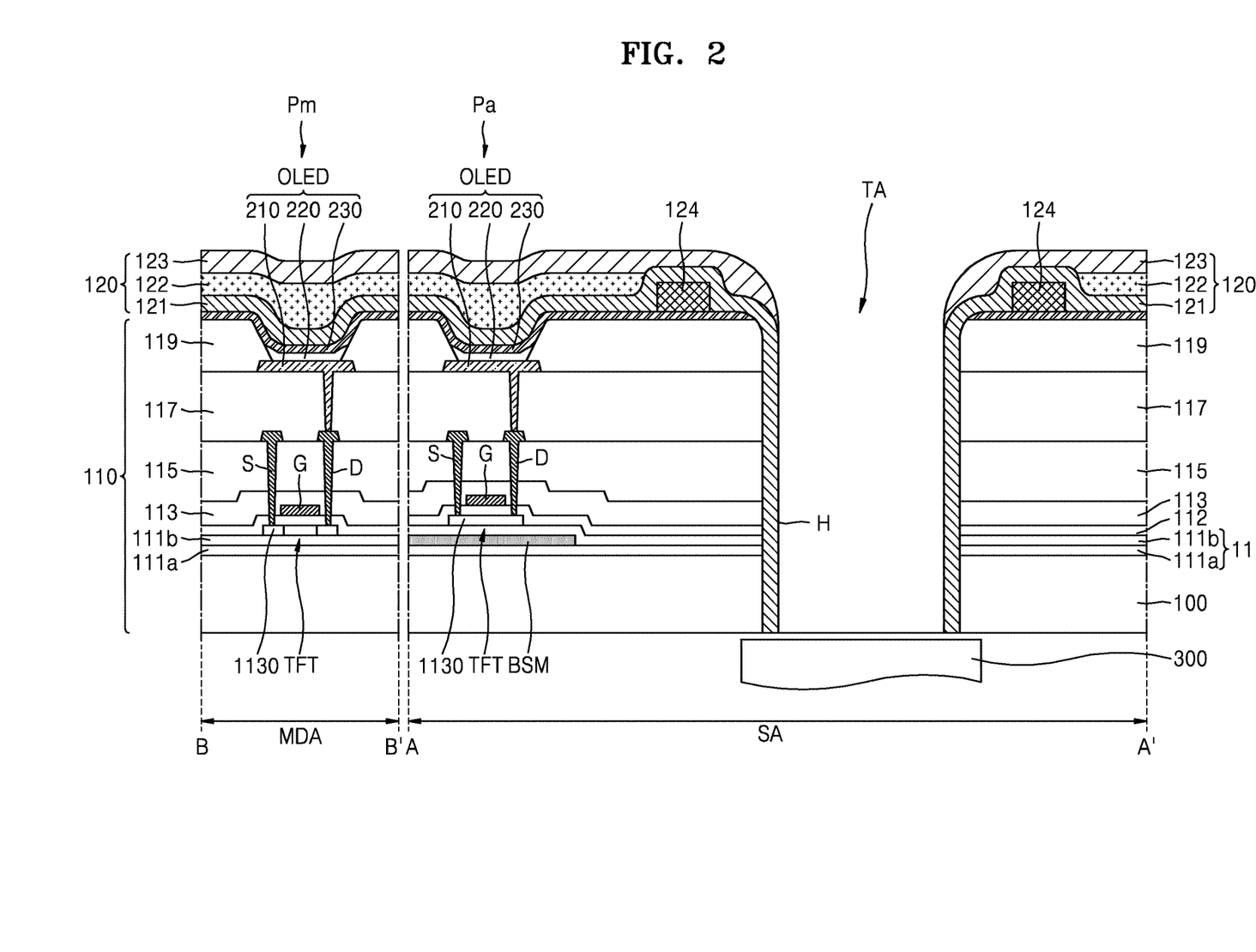
FIG. 2 is a cross-sectional view of the display device taken along the lines A-A' and B-B' of FIG. 1.

FIG. 2 is a cross-sectional view of the display device 1 taken along the lines A-A' and B-B' of FIG. 1. That is, cross-sectional structures of an auxiliary pixel Pa and a transmission portion TA of the sensor area SA, and of a main pixel Pm of the main display area MDA, are shown. The main pixel Pm and the auxiliary pixel Pa include an organic light-emitting diode OLED and a thin film transistor TFT having basically the same structure in the pixels Pm and Pa. As described above, the main pixel Pm and the auxiliary pixel Pa are different in only the number of arrangements per unit area. For convenience of description, an organic light-emitting diode OLED of the main pixel Pm is also referred to as a main light-emitting element, and an organic light-emitting diode OLED of the auxiliary pixel Pa is also referred to as an auxiliary light-emitting element.

First, the display device 1 includes the substrate 100, includes the main display area MDA and the sensor area SA provided to the substrate 100, and includes the component 300 arranged below the substrate 100, the component 300 corresponding to the sensor area SA.

The component 300 may include an electronic element that uses light or sound. For example, an electronic element may be a sensor, such as an infrared sensor, that emits and/or receives light, a sensor that outputs and senses light or sound to measure a distance or recognize a fingerprint, a small lamp that outputs light, or a speaker that outputs sound. An electronic element that uses light may use light in various wavelength bands, such as visible light, infrared light, and ultraviolet light. The component 300 arranged in the sensor area SA may be provided as a plurality of components. For example, as the component 300, a light-emitting element and a light-receiving element may be provided together in one sensor area SA. Alternatively, a light emitter and a light receiver may be simultaneously provided to one component 300.

Next, description of some of the elements is made one-by-one from the substrate 100. The substrate 100 may include a soft substrate that is transformable. The soft substrate may include a polymer resin. The polymer resin may include polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 100 including the polymer resin may be flexible, rollable, or bendable. The substrate 100 may have a multi-layered structure including a layer including a polymer resin and a layer including an inorganic layer.

A buffer layer 111 on the substrate 100 may reduce or block penetration of foreign substances, moisture, or external air from below the substrate 100, and may provide a flat surface. The buffer layer 111 may include an inorganic material, such as an oxide or a nitride, may include an organic material, or may include an organic/inorganic composite material, and may also include a single-layered or multi-layered structure of an inorganic material and an organic material. A barrier layer for blocking penetration of external air may be further arranged between the substrate 100 and the buffer layer 111. As shown in the drawing, the buffer layer 111 may have a structure in which a first buffer layer 111a and a second buffer layer 111b are stacked.

A semiconductor layer 1130 is arranged over the buffer layer 111, and a gate electrode G is arranged over the semiconductor layer 1130 with a first gate insulating layer 112 between the buffer layer 111 and the gate electrode G. The gate electrode G may include at least one of Mo, Al, Cu, and Ti, and may include a single layer or a multi-layer. For example, the gate electrode G may include a single Mo layer.

The first gate insulating layer 112 may include $SiO_2$, SiNx, SiON, $Al_2O_3$, $TiO_2$, $Ta_2O_5$, $HfO_2$, or $ZnO_2$.

A second gate insulating layer 113 may cover the gate electrode G. The second gate insulating layer 113 may include $SiO_2$, SiNx, SiON, $Al_2O_3$, $TiO_2$, $Ta_2O_5$, $HfO_2$, or $ZnO_2$.

A source electrode S and a drain electrode D may be arranged on an interlayer insulating layer 115. The source electrode S and the drain electrode D may include a conductive material including Mo, Al, Cu, and Ti, and may include a single layer or a multi-layer including the above materials.

The drain electrode D is connected to an anode layer 210 of an organic light-emitting diode OLED.

A planarization layer 117 is located on the source electrode S and the drain electrode D. The organic light-emitting diode OLED may be located on the planarization layer 117.

The planarization layer 117 may have a flat surface such that the anode layer 210 may be formed flat. The planarization layer 117 may include a single layer or a multi-layer including an organic material. The planarization layer 117 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include an inorganic material. The planarization layer 117 may include $SiO_2$, SiNx, SiON, $Al_2O_3$, $TiO_2$, $Ta_2O_5$, $HfO_2$, or $ZnO_2$. In the case where the planarization layer 117 includes an inorganic material, chemical planarization polishing may be performed, depending on a case. The planarization layer 117 may include both an organic material and an inorganic material.

The anode layer 210 may include a (semi) transmissive electrode or a reflective electrode. In an embodiment, the anode layer 210 may include a reflective layer, and a transparent or semi-transparent electrode layer on the reflective layer, the reflective layer including at least one of Ag, Mg, Al, Pt, Pd, Au, Ni, Nd, Ir, Cr, and/or a compound thereof. The transparent or semi-transparent electrode layer may include at least one of indium tin oxide (ITO), zinc oxide (IZO), zinc oxide (ZnO), indium oxide ($In_2O_3$), indium gallium oxide (IGO), and aluminum zinc oxide (AZO). In an embodiment, the anode layer 210 may have a stacked structure of ITO/Ag/ITO.

A pixel-defining layer 119 may be arranged on the planarization layer 117. The pixel-defining layer 119 may be formed through spin coating, etc. by using an organic insulating material such as polyimide, polyamide, an acrylic resin, and HMDSO.

An intermediate layer 220 of the organic light-emitting diode OLED may include an organic emission layer. The organic emission layer may include an organic material including a fluorescent or phosphorous material emitting red, green, blue, or white light. The organic emission layer may include a low molecular weight organic material or a polymer organic material. A functional layer may be selectively further arranged on and/or under the organic emission layer, the functional layer including a hole transport layer (HTL), a hole injection layer (HIL), an electron transport layer (ETL), and an electron injection layer (EIL). The intermediate layer 220 may be arranged to correspond to a plurality of anode layers 210. However, the embodiment is not limited thereto. The intermediate layer 220 may include a layer that is one body over the plurality of anode layers 210. However, various modifications may be made.

A cathode layer 230 may include a transmissive electrode or a reflective electrode. In an embodiment, the cathode layer 230 may include a transparent or semi-transparent electrode, and may include a metal thin layer having a small work function and including at least one of Li, Ca, LiF/Ca, LiF/Al, Al, Ag, Mg, and/or a compound thereof. The cathode layer 230 may be arranged over the main display area MDA and the sensor area SA, and may be arranged on the intermediate layer 220 and the pixel-defining layer 119.

Also, a blocking layer BSM is arranged between the semiconductor layer 1130 and a portion of the substrate 100 that corresponds to an auxiliary pixel Pa. The blocking layer BSM prevents a thin film transistor TFT from being influenced by a light signal or a sound signal of the component 300 adjacent thereto.

A thin-film encapsulation layer 120 is formed on the cathode layer 230, the thin-film encapsulation layer 120 including at least one inorganic layer 121 or 123 and at least one organic layer 122 that are stacked. The inorganic layers 121 and 123 may include at least one inorganic insulating material including aluminum oxide, titanium oxide, tantalum oxide, hafnium oxide, zinc oxide, silicon oxide, silicon nitride, and silicon oxynitride. The organic layer 122 may include polyethylene terephthalate (PET), polyethylene naphthalate (PEN), polycarbonate (PC), polyimide, polyethylene sulfonate, polyoxymethylene, polyarylate, HMDSO, an acrylic resin (e.g. PMMA, polyacrylic acid, etc.), or an arbitrary combination thereof. The thin-film encapsulation layer 120 covers the main pixel Pm and the auxiliary pixel Pa, and blocks penetration of external oxygen or moisture.

The transmission portion TA is provided as a transmission hole H that completely passes through from the substrate 100 to the thin-film encapsulation layer 120. That is, when viewed from above the thin-film encapsulation layer 120, the component 300 is completely exposed and viewed through the transmission hole H. However, because a window covers an upper surface of a product, the component 300 is not exposed in a final product, the component 300 is directly exposed through the transmission hole H when the thin-film encapsulation layer 120 is formed. The reason why the transmission hole H that completely passes through layers is formed is because the transmission hole H is not formed to a proper depth by using a laser, etc. but is naturally formed during a process of forming a layer by using a hard substrate 400 including an empty space 401 (see FIG. 3A), as will be described below. A detailed process thereof is described below.

Also, ends that contact the transmission hole H, that is, ends of stacked layers, ranging from the substrate 100 to a layer under the thin-film encapsulation layer 120, which contact the transmission hole H, are covered by the inorganic layers 121 and 123 of the thin-film encapsulation layer 120. Because an exposed portion may serve as a moisture transmission path through which moisture penetrates in the case where the ends that contact the transmission hole H are exposed to external air, such covering structure of the inorganic layers 121 and 123 is provided for blocking the moisture transmission path.

Further provided is a dam 124 configured to prevent the organic layer 122 from flooding the transmission hole H, the organic layer 122 having good fluidity in the thin-film encapsulation layer 120. A reference numeral 110 represents layers of the display unit ranging from the substrate 100 to the organic light-emitting diode OLED. In the description of processes below, for convenience of description, these layers are simply and collectively represented by a display layer 110.

As described above, a process of manufacturing a display device according to an embodiment that uses the hard substrate 400, and a result thereof, are described in detail with reference to FIGS. 3A to 3H.

Figure 3A:
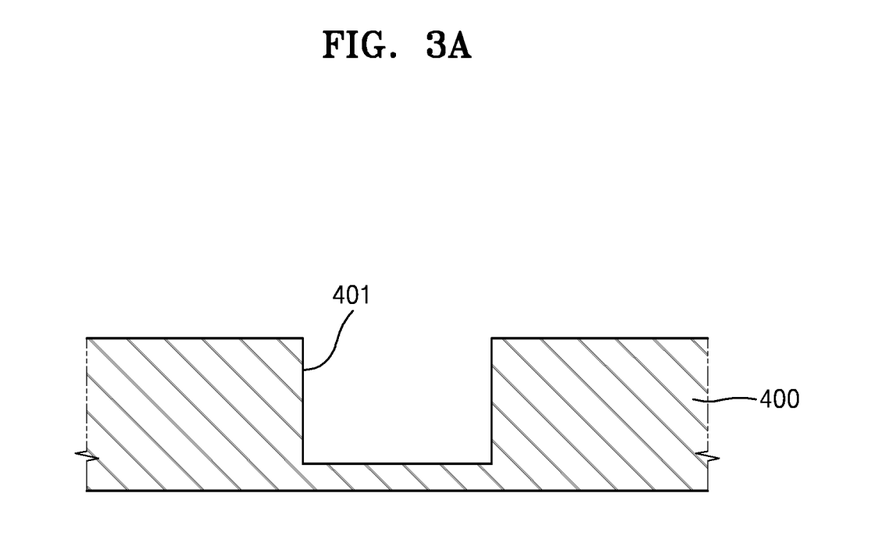
FIGS. 3A to 3H are sequential cross-sectional views of a process of manufacturing the display device shown in FIG. 1.

First, as shown in FIG. 3A, the hard substrate 400, which may include a glass material, is prepared, and an empty space 401 is formed at a location corresponding to the transmission portion TA by using a laser, etc.

Figure 3B:
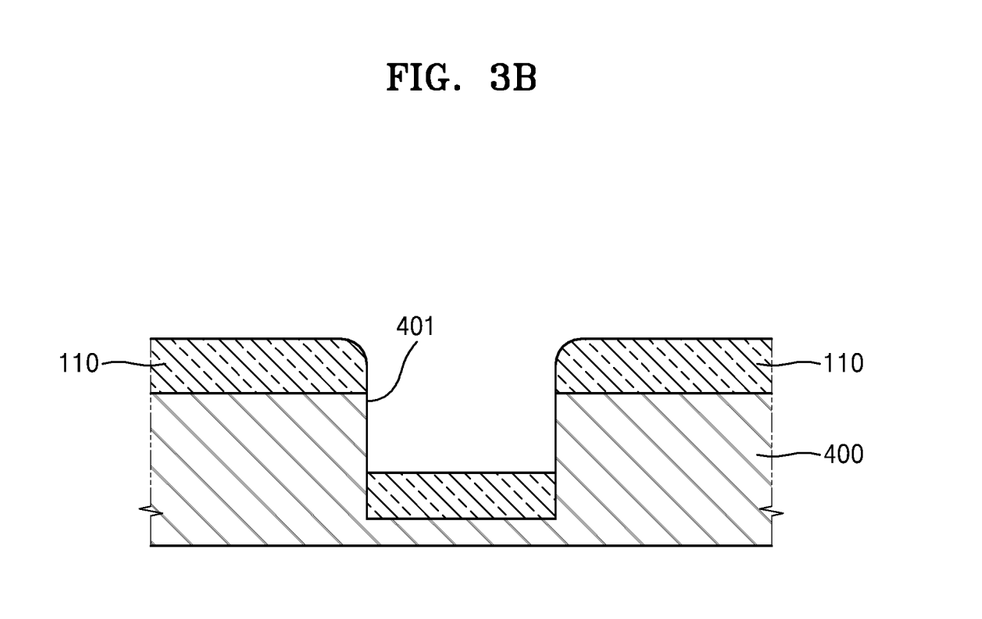

When the hard substrate 400 in which the empty space 401 is formed is prepared, as shown in FIG. 3B, the display layer 110 (e.g., layers ranging from the substrate 100 to the organic light-emitting diode OLED) is formed on the hard substrate 400. In this case, the substrate 100 is a soft substrate including a transformable material, such as polyimide. A substrate that is left afterwards becomes the soft substrate 100, and the hard substrate 400 is removed during the process. For discrimination from the hard substrate 400, the substrate 100 is referred to as the soft substrate below. While the display layer 110 is formed, the relevant layers are equally formed inside the empty space 401. Because the relevant layers are formed inside the empty space 401, the relevant layers are disconnected without continuity with the surroundings.

Figure 3C:
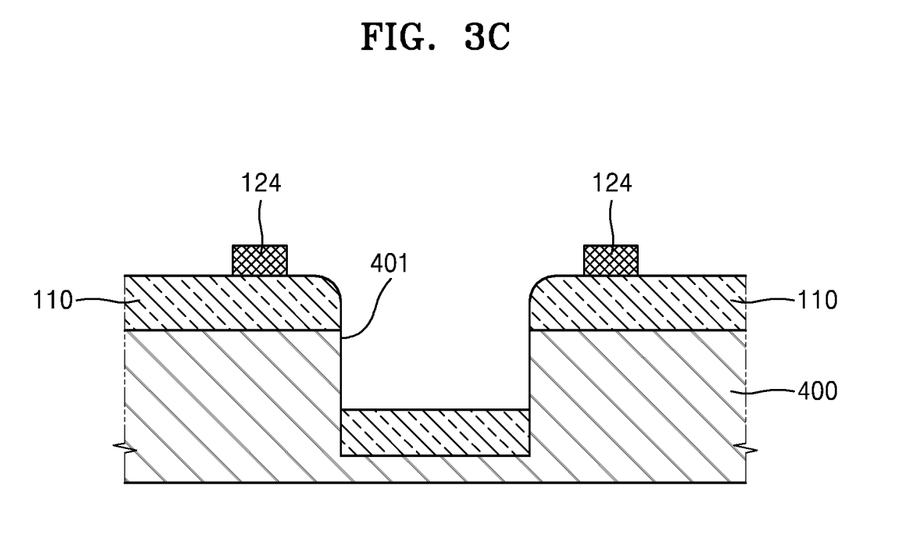

After the display layer 110 is formed, the dam 124 is formed around the empty space 401, as shown in FIG. 3C. The dam 124 may include a glass material. The dam 124 prevents the organic layer 122 of the thin-film encapsulation layer 120, which will be formed next, from flooding the empty space 401.

Figure 3D:
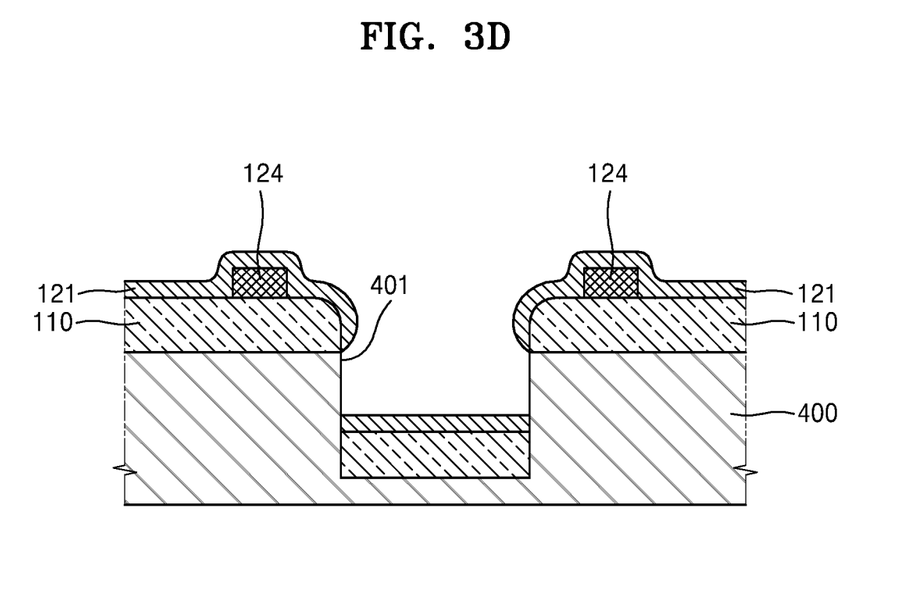

Subsequently, as shown in FIG. 3D, the first inorganic layer 121 of the thin-film encapsulation layer 120 is formed. The first inorganic layer 121 covers the display layer 110 and the dam 124, is formed inside the empty space 401, and covers ends of the display layer 110 that contact the empty space 401. Because the empty space 401 becomes the transmission hole H later, it is considered that the ends of the display layer 110 contact the transmission hole H. With this configuration, because the first inorganic layer 121 covers the ends of the display layer 110, which may otherwise provide a moisture transmission path, a display device having an excellent moisture-proofing performance may be implemented.

Figure 3E:
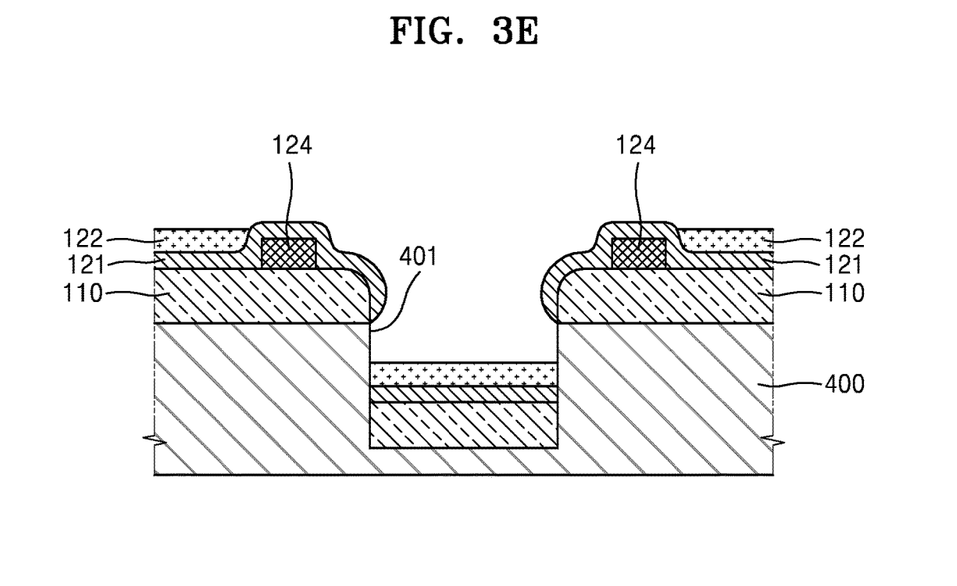

Next, as shown in FIG. 3E, the organic layer 122 of the thin-film encapsulation layer 120 is formed. In this case, because the organic layer 122 has excellent fluidity, the organic layer 122 may otherwise flood into the empty space 401, although the dam 124 formed in advance may properly block the flooding.

Figure 3F:
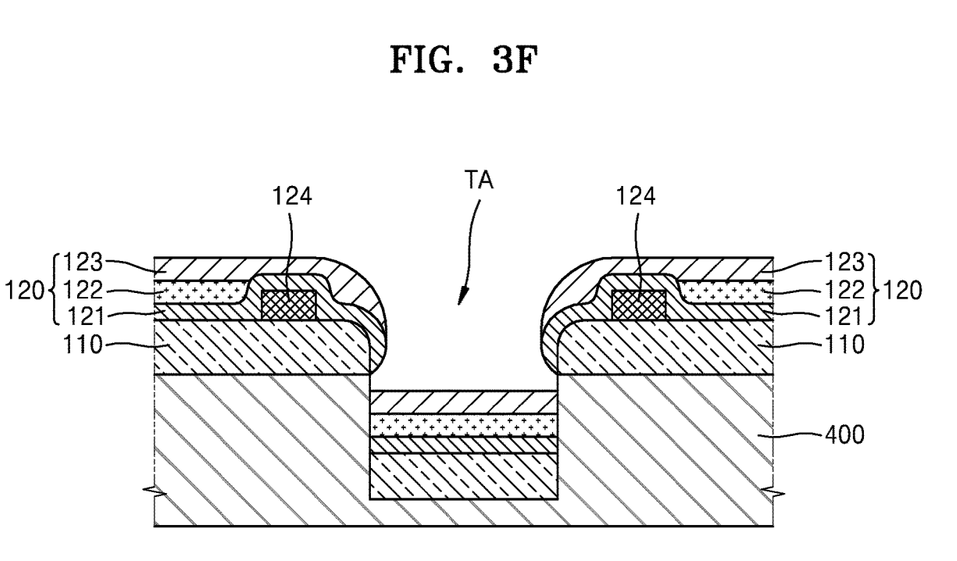
Figure 3G:
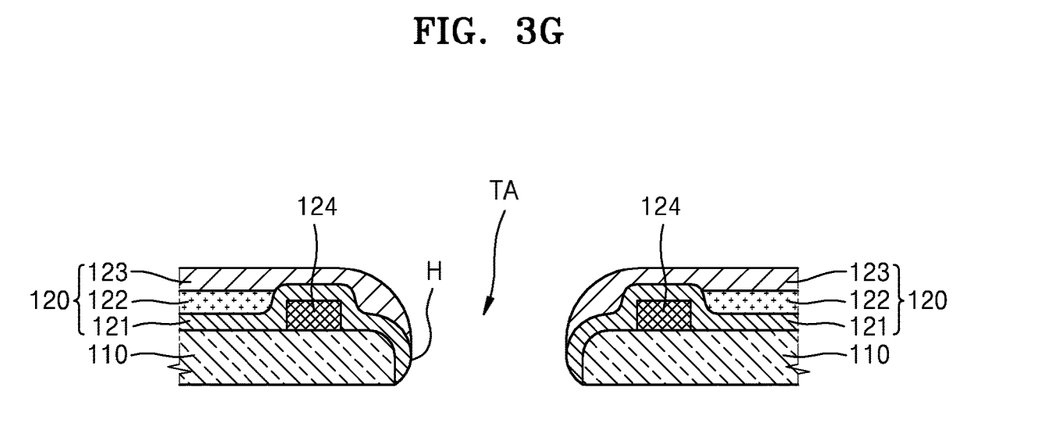

The second inorganic layer 123 of the thin-film encapsulation layer 120 is formed, as shown in FIG. 3F, and subsequently, the hard substrate 400 is removed, as shown in FIG. 3G. Then, a display device in which the soft substrate 100 serves as a base substrate is implemented, and simultaneously, the transmission hole H is immediately formed at a location where the empty space 401 is present.

Figure 3H:
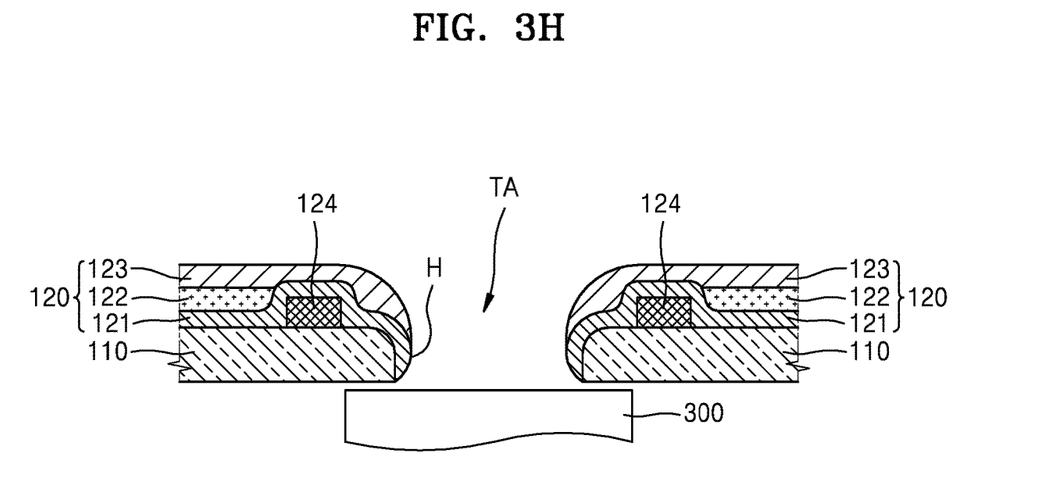

Therefore, as shown in FIG. 3H, when the component 300 is installed, an environment in which the component 300 may exchange a signal with a side beyond the substrate 100 is formed.

Consequently, because the transmission hole H is naturally formed through a process of forming the display layer 110 and the thin-film encapsulation layer 120, it is not required to pattern the transmission hole H whenever respective layers of the display layer 110 are formed, and thus an operation is simplified. Also, because a boring operation using a laser, etc. is not performed, the danger of wiring damage otherwise caused by the laser is removed. Also, because the inorganic layers (that is, the first inorganic layer 121 and the second inorganic layer 123 of the thin-film encapsulation layer 120) cover the ends of the display layer 110 that contact the transmission hole H, moisture transmission possibility may be sufficiently suppressed.

Therefore, according to the above embodiment, a very stable display device having an excellent moisture-proofing performance along with a simple manufacturing process may be implemented.

Figure 4A:
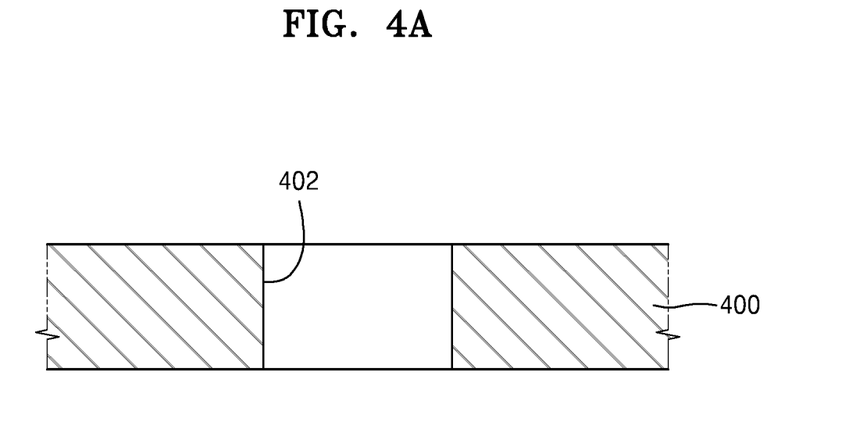
FIGS. 4A and 4B are cross-sectional views of an example of a modification of an empty space formed in a hard substrate shown in FIG. 3A.
Figure 4B:
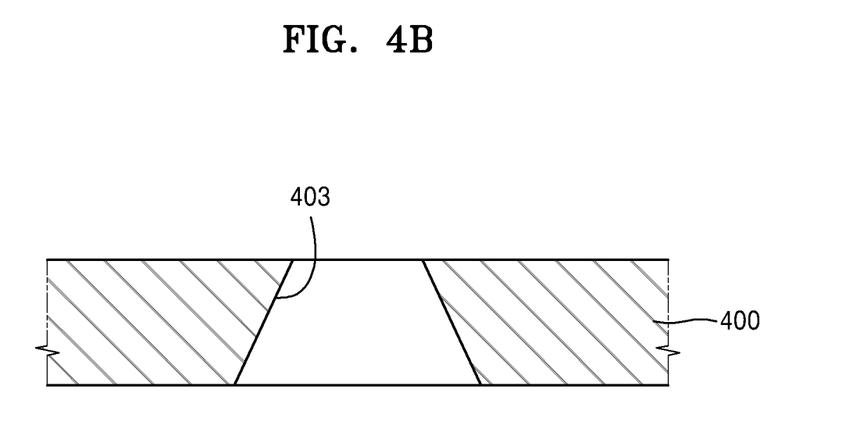

Though the above embodiment provides, as an example, the case where the empty space 401 of the hard substrate 400 is not completely bored, but is instead a recess indented to a depth (e.g., to a predetermined depth), as shown in FIGS. 4A and 4B, complete empty spaces/through holes 402 and/or 403 may be formed. Also, as shown in FIG. 4A, the empty space/through hole 402 in which inner walls thereof facing each other are parallel to each other may be provided, or as shown in FIG. 4B, the empty space/through hole 403 in which inner walls thereof facing each other are not parallel to each other may be provided. Likewise, as shown in FIG. 3A, the empty space/recess 401 may be a recess in which inner walls thereof facing each other are parallel to each other, or the empty space/recess 401 may be a recess in which inner walls thereof facing each other are not parallel to each other.

Also, empty spaces 401, 402, and 403 of the hard substrate 400 may be utilized as marks for alignment for aligning a mask while respective layers of the display layer 110 are deposited. That is, to form respective layers of the main display area MDA and the sensor area SA, deposition may be performed with a mask having a relevant pattern put on the hard substrate 400. In this case, location alignment between the mask and the hard substrate 400 may be performed based on the empty spaces 401, 402, and 403.

According to the structure and the manufacturing method described above, an image may be displayed even in the sensor area SA corresponding to the component 300, and the transmission hole H is naturally formed through a process of forming a layer on the substrate without a separate boring process that uses a laser, etc. Therefore, the manufacturing process may be simplified. Also, because moisture transmission may be solidly blocked by covering the surroundings of the transmission hole H with the inorganic layers, a likelihood of early deterioration of a product may be reduced or prevented, and the life of the product may be guaranteed.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their functional equivalents.

What is claimed is:

1. A display device comprising:
   a substrate;
   a display unit over the substrate, and comprising a main display area comprising a main pixel, and a sensor area comprising an auxiliary pixel and a transmission portion;
   a thin-film encapsulation layer covering the main pixel and the auxiliary pixel of the display unit; and
   a component for exchanging a signal through the transmission portion,
   wherein the transmission portion comprises a transmission hole passing through the substrate and the thin-film encapsulation layer.

2. The display device of claim 1, wherein the thin-film encapsulation layer comprises at least one organic layer and at least one inorganic layer that are stacked.

3. The display device of claim 2, wherein the at least one inorganic layer of the thin-film encapsulation layer covers an end of a layer between the substrate and the thin-film encapsulation layer, the end being adjacent the transmission hole.

4. The display device of claim 3, wherein the at least one inorganic layer of the thin-film encapsulation layer covers an end of the substrate adjacent the transmission hole.

5. The display device of claim 2, wherein the thin-film encapsulation layer comprises a plurality of inorganic layers with the at least one organic layer therebetween.

6. The display device of claim 1, wherein the substrate comprises a transformable soft substrate.

7. The display device of claim 1, wherein the component comprises a sensor, a lamp, or a speaker.

8. A display device comprising:
   a substrate;
   a display unit over the substrate, and comprising a main display area comprising a main pixel, and a sensor area comprising an auxiliary pixel and a transmission portion defining a transmission hole;
   a thin-film encapsulation layer covering the main pixel and the auxiliary pixel of the display unit, and comprising at least one organic layer and at least one inorganic layer that are stacked;
   a component for exchanging a signal through the transmission portion; and
   a dam around the transmission hole for blocking the at least one organic layer of the thin-film encapsulation layer from flooding the transmission hole,
   wherein the transmission hole passes through the substrate and the thin-film encapsulation layer.

9. A method of manufacturing a display device, the method comprising:
   forming a display unit comprising a main display area and a sensor area over a soft substrate, the main display area comprising a main pixel, and the sensor area comprising an auxiliary pixel and a transmission portion, the forming of the display unit comprising:
      preparing a hard substrate defining an empty space corresponding to a location of the transmission portion;
      forming the soft substrate on the hard substrate;
      forming the main display area and the sensor area on the soft substrate;
      forming a thin-film encapsulation layer covering the main display area and the sensor area; and
      forming a transmission hole in the empty space by removing the hard substrate, the transmission hole passing through the soft substrate and the thin-film encapsulation layer; and
   arranging a component on one side of the soft substrate, the component for communicating a signal through the transmission portion.

10. The method of claim 9, wherein the forming of the thin-film encapsulation layer comprises stacking at least one organic layer and at least one inorganic layer.

11. The method of claim 10, further comprising forming a dam around the transmission hole for blocking the at least one organic layer of the thin-film encapsulation layer from flooding the transmission hole.

12. The method of claim 10, wherein the at least one inorganic layer of the thin-film encapsulation layer covers an end of a layer between the soft substrate and the thin-film encapsulation layer, the end being adjacent the transmission hole.

13. The method of claim 12, wherein the at least one inorganic layer of the thin-film encapsulation layer covers an end of the soft substrate adjacent the transmission hole.

14. The method of claim 10, wherein the thin-film encapsulation layer comprises a plurality of inorganic layers with the at least one organic layer therebetween.

15. The method of claim 9, wherein the hard substrate comprises a glass substrate.

16. The method of claim 9, wherein the empty space comprises a hole that completely passes through the hard substrate, or a recess that is indented in the hard substrate, the hard substrate comprising a glass substrate.

17. The method of claim 9, wherein inner walls of the empty space that face each other are formed in parallel to each other.

18. The method of claim 9, wherein inner walls of the empty space that face each other are formed non-parallel to each other.

19. The method of claim 9, wherein the component comprises a sensor, a lamp, or a speaker.

20. The method of claim 9, further comprising using the empty space as a mark for alignment with a mask while the mask for forming the main display area and the sensor area is installed.

* * * * *